United States Patent [19]

Nakagawa

[11] Patent Number: 5,272,365
[45] Date of Patent: Dec. 21, 1993

[54] SILICON TRANSISTOR DEVICE WITH SILICON-GERMANIUM ELECTRON GAS HETERO STRUCTURE CHANNEL

[75] Inventor: Akio Nakagawa, Hiratsuka, Japan
[73] Assignee: Kabushiki Kaisha Toshiba, Kawasaki, Japan
[21] Appl. No.: 887,667
[22] Filed: May 26, 1992

Related U.S. Application Data

[63] Continuation of Ser. No. 674,883, Mar. 26, 1991, abandoned.

[30] Foreign Application Priority Data

Mar. 29, 1990 [JP] Japan .................................... 2-78905

[51] Int. Cl.$^5$ ................. H01L 29/161; H01L 29/205; H01L 29/225; H01L 27/14
[52] U.S. Cl. .................... 257/194; 257/190; 257/191; 257/192; 257/195; 257/289; 257/327
[58] Field of Search ................... 357/16; 257/12, 17, 257/19, 20, 22, 24, 190, 191, 192, 194, 195, 289, 327

[56] References Cited

U.S. PATENT DOCUMENTS

| 4,994,866 | 2/1991 | Awano | 357/16 |
| 5,012,304 | 4/1991 | Kash et al. | 357/16 |
| 5,019,882 | 5/1991 | Solomon et al. | 357/16 |

FOREIGN PATENT DOCUMENTS

| 0307850 | 3/1989 | European Pat. Off. |
| 0397987 | 11/1990 | European Pat. Off. |
| 3811821 | 10/1988 | Fed. Rep. of Germany |

OTHER PUBLICATIONS

Mochigetsu "Satellite Broadcasting Reception HEMTs having Noise Characteristics of Less Than 1dB" *Nikkei Microdevices* Apr. 1989 pp. 91-95.
Mishima et al "Effect of Interface Quality on the Electrical Properties of p-Si/SiGe 2-D Hole Gas System" *Appl Phys Lett* vol. 57 No. 24 Dec. 10, 1990 pp. 2567-2569.
IEEE Electron Device Letters, vol. 11, No. 1, Jan. 1990; "Suppression of Hot-Carrier Degradation in Si MOSFET's by Germanium Doping"; pp. 45-47; Chien-Shing Pai, William M. Mansfield, and Glenn A. Clarke.
IEEE Electron Device Letters, vol. EDL-7, No. 5, May 1986; "Enhancement- and Depletion-Mode p-- Channel $Ge_xSi_{1-x}$ Modulation-Doped FET's"; pp. 308-310; T. P. Pearsall and John C. Bean.
"Silicon Germanium-Base Heterojunction Bipolar Transistors by Molecular Beam Epitaxy", G. L. Patton et al; IEEE Electron Device Letters, vol. 9, No. 4, Apr. 1988.

*Primary Examiner*—Jerome Jackson
*Assistant Examiner*—Valencia M. Martin
*Attorney, Agent, or Firm*—Oblon, Spivak, McClelland, Maier & Neustadt

[57] ABSTRACT

A metal oxide semiconductor field effect transistor with heterostructure has a silicon substrate. Heavily-doped source and drain layers which are different in conductivity type from the substrate are spaced apart from each other in the surface portion of the substrate. A gate electrode of polycrystalline silicon is disposed above the substrate, and is electrically insulated from the substrate by a gate insulation layer made of thermal silicon oxide thin film. A silicon germanium layer is laterally provided in a preselected substrate surface section positioned between the source and drain layers. This layer partially overlaps the source and drain layers at both of its end portions, and is thus electrically in contact with these layers. The silicon germanium layer acts as a channel of the transistor.

12 Claims, 3 Drawing Sheets

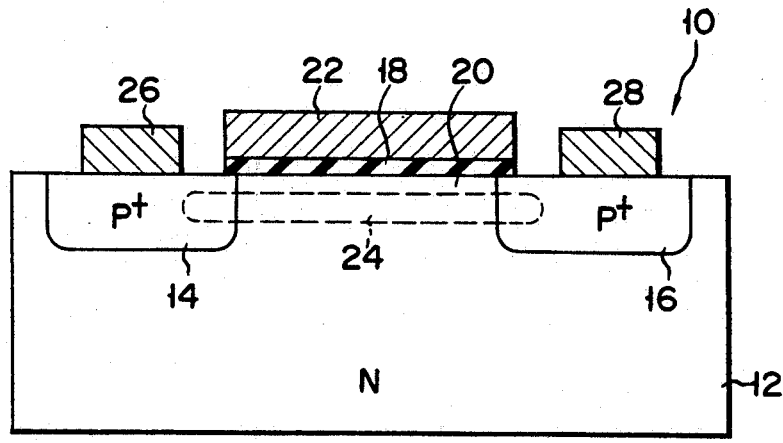
F I G. 1
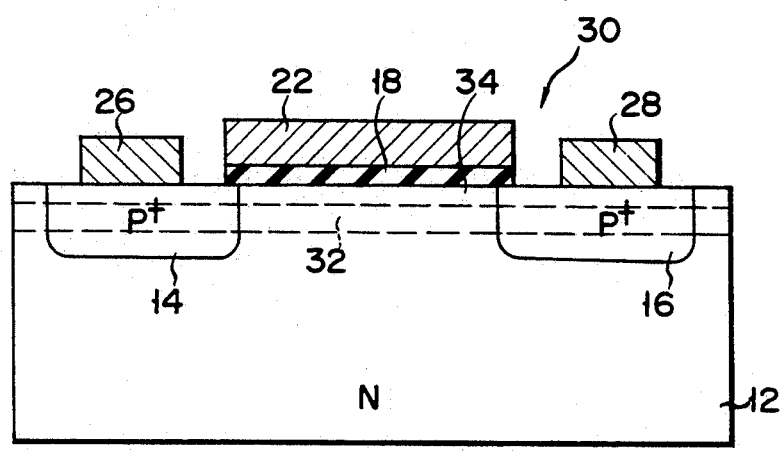
F I G. 2
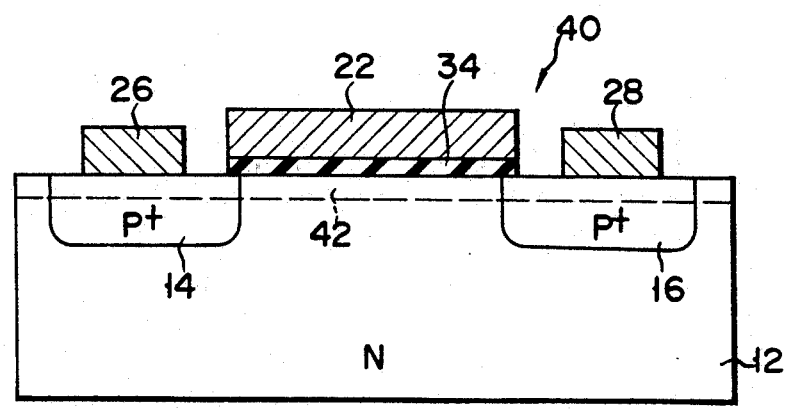
F I G. 3

SILICON TRANSISTOR DEVICE WITH SILICON-GERMANIUM ELECTRON GAS HETERO STRUCTURE CHANNEL

This application is a continuation of application Ser. No. 07/674,883, filed on Mar. 26, 1991, now abandoned.

BACKGROUND OF THE INVENTION

1. Field of the Invention

The present invention relates generally to semiconductor devices and, more particularly, to a high-speed transistor device with a hetero-junction structure.

2. Description of the Related Art

Conventionally, a high-electron mobility transistor, called the "HEMT" has been well known among those skilled in the art as a semiconductor field effect transistors capable of executing high-speed switching operations by utilizing a hetero-junction structure. Such type of transistor may be defined as the field effect transistor which is comprised of gallium arsenide and gallium aluminum arsenide, with a Schottky metal contact on the gallium aluminum arsenide layer and two ohmic contacts penetrating into the gallium arsenide layer, serving as the gate, source and drain respectively.

In the HEMT, what is called the "two-dimensional electron gas" spreads inside a non-doped gallium arsenide layer functioning as the channel region, to thereby attain high-speed transistor operations. The electron mobility of the HEMT can further improved by using the gallium arsenide layer as a channel region, because of its high electron mobility. As a result, extra-high-speed switching operations can be accomplished for the HEMT.

However, the gallium-arsenide high-electron mobility materials come with a serious technical problem: It is very difficult to make a gate insulation layer of high quality, which has been easily obtained in the metal oxide semiconductor field effect transistors (MOSFETs) using one of the most popular semiconductor materials, i.e., silicon. Due to such difficulty in manufacture of the gate insulation layer, HEMTs are not manufactured successfully using the presently available manufacturing technology, having the insulated-gate (insulated gate) type. For these reasons, development of a very high switching speed transistor is difficult.

SUMMARY OF THE INVENTION

It is therefore an object of the present invention to provide a new and improved semiconductor device with heterostructure which can execute its switching operations at high speed.

In accordance with the above object, the present invention is drawn to a specific semiconductor transistor structure, which has a semiconductive substrate, at least one semiconductive active layer formed in the surface of the substrate, and a channel region which is defined within the substrate so as to be in contact with the active layer. The channel region has a heterojunction structure containing therein a preselected kind of semiconductor doping species. The substrate is made of silicon, whereas the channel region is made of silicon germanium layer containing doped-germanium. The silicon germanium layer may be manufactured using the presently existing manufacturing technique such as the ion-implantation of germanium, the epitaxial method, etc.

The foregoing and other objects, features and advantages of the invention will become more apparent in the detailed description which will be presented below.

BRIEF DESCRIPTION OF THE DRAWINGS

In the detailed description of preferred embodiments of the present invention presented below, reference is made to the accompanying drawings in which:

FIG. 1 is a diagram schematically showing a cross-sectional view of the main part of an insulated-gate semiconductor transistor in accordance with one preferred embodiment of the present invention;

FIG. 2 is a diagram schematically showing a cross-sectional view of the main part of an insulated gate semiconductor transistor in accordance with another embodiment of the present invention;

FIG. 3 is a diagram schematically showing a cross-sectional view of the main part of an insulated-gate semiconductor transistor in accordance with a still another embodiment of the present invention;

DETAILED DESCRIPTION OF THE PREFERRED EMBODIMENTS

Figure 4:
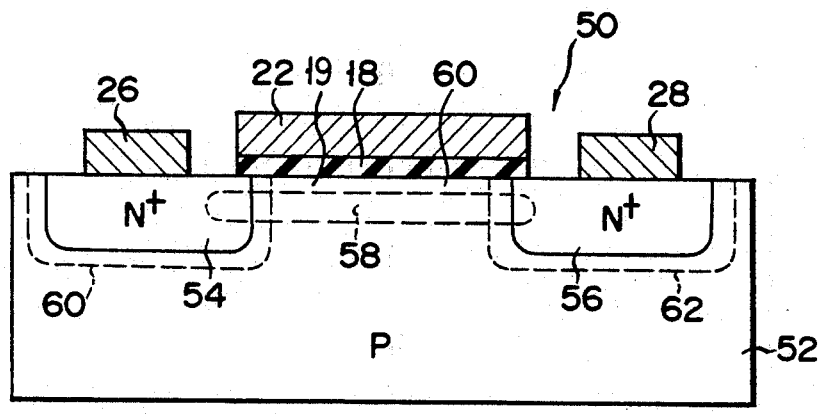
FIG. 4 is a diagram schematically showing a cross-sectional view of the main part of an insulated-gate semiconductor transistor in accordance with a further embodiment of the present invention.

Referring now to FIG. 1, a P-channel type metal oxide semiconductor field effect transistor or MOSFET in accordance with one preferred embodiment of the present invention is generally designated by reference numeral "10." The MOSFET 10 has a silicon substrate 12 of N type conductivity. The N type substrate 12 has a top surface, in which a couple of heavily-doped P type (referred to as "P+ type" hereinafter) semiconductor layers 14 and 16 are formed by diffusion so that they are spaced apart from each other by a preselected distance. The P+ type diffusion layer 14 serves as a source region for the MOSFET 10, whereas the P+ type diffusion layer 16 acts as a drain region therefor.

A thermal silicon oxide thin-film 18 is formed in a certain surface portion 20 which is positioned between the source layer 14 and the drain layer 16. On the layer 18 is formed a polycrystalline silicon layer 22 which is substantially self-aligned with the layers 14 and 16. The polycrystalline silicon layer 22 acts as the gate electrode of the MOSFET 10, while the underlying thermal oxide thin-film 18 functions as a gate insulation layer.

A specific kind of semiconductor doping species, such as germanium, is doped as an impurity into the surface portion of the silicon substrate 12 which is positioned beneath the gate insulation layer 18. A well-known ion-implantation method may be utilized to execute such doping of germaniun. A silicon germanium layer 24 is formed in the substrate surface portion. In this embodiment, the silicon germanium layer 24 is so defined as to be positioned in a preselected depth to have a predetermined thickness of its own, while allowing a shallow surface region of the substrate 12 to be maintained as a silicon layer, as shown in FIG. 1. The silicon germanium layer 24 extends to enter into and partly overlap the source layer 14 and drain layer 16 at its both end portions, whereby the layer 24 is in contact with these layers 14 and 16. A patterned metallic layer 26 made of aluminum is arranged on the source layer 14. A patterned aluminum layer 28 is formed on the drain layer 16.

The MOSFET 10 shown in FIG. 1 may be manufactured using a manufacturing method, which will be described below. First, a thermal oxide thin-film is formed in an element-formation area of the substrate 12. This thin-film serves as a buffer layer for ion implantation of impurity. Doping of germanium impurity is carried out so that the silicon germanium layer 24 is formed only in a selected region of the substrate 12. The layer 24 is located at a specific position of depth of the channel region of the MOSFET 10. In order to minimize the generation of mismatching or dislocation in the crystal lattice, it should be recommendable that the doping amount of germanium is limited to meet the following condition: The amount of germanium in the resultant silicon germanium layer 2 obtained by the ion implantation, i.e., the impurity concentration of germanium, is substantially equal to or less than thirty percent of the overall semiconductor amount of the substrate.

A gate insulation layer 18 is formed on the thermal oxide thin-film. A polycrystalline silicon layer is deposited on the gate insulation layer 18. The resultant double-layered structure is then subjected to a well-known photo-patterning process to obtain the gate electrode 22.

Subsequently, a preselected kind of semiconductor doping species of P type conductivity is selectively implanted into the substrate 12, with the gate electrode 22 being as a mask. The source layer 14 and the drain layer 16 are thus formed which are spaced apart from each other by a predetermined distance as shown in FIG. 1. A chemical vapor deposition is carried out so that a $SiO_2$ layer is deposited to cover the entire top surface of the substrate 12. The insulative layer is patterned to define contact holes therein. Aluminum layers 26 and 28 are formed in these contact holes as the aforementioned source and drain electrodes of the MOSFET 10.

In the MOSFET 10 shown FIG. 1, when a certain voltage of negative polarity is applied to the gate electrode 22, a channel region is defined in a specific surface region of the substrate 12 which is positioned just beneath the gate insulation layer 18. Holes appear also in an interface region between the silicon layer section 20 and the silicon germanium layer 24 that is narrower in its band gap than the silicon layer section 20. The interface region between the silicon germanium layer 24 and the silicon layer section 20 may act as a second channel region for the MOSFET 10. A potential barrier is created due to the existence of the silicon layer section 20 of wide band gap which is positioned on the silicon germanium layer 24. The holes moving inside this second channel region are prevented by the potential barrier from coming into collision with the gate insulation layer 18. This enables the holes to run successfully through the channel region. The switching operation speed of the MOSFET 10 can thus be improved. In addition, the mutual conductance gm can be enhanced due to the fact that the gate insulation layer 18 is made of thermal silicon oxide thin-film.

Furthermore, according to this embodiment, the silicon germanium layer 24 is specifically arranged as shown in FIG. 1 such that it laterally extends across the substrate surface portion defined between the source layer 14 and the drain layers 16. This means that any potential barrier, which blocks the passage of charge carriers moving from the source layer 14 to the channel, will no longer be generated, which can improve the efficiency of carrier injection between the source layer 14 and the channel. Such improved efficiency of carrier injection will contribute to enhancement in the basic operation characteristics of the MOSFET 10.

It should be noted in the above embodiment that the silicon germanium layer 24 is required to be positioned accurately within an effective range of electric field being created in the substrate due to external application of a voltage to the gate electrode 22. The effective range of the internal electric field may be determined depending upon the physical dielectric breakdown characteristic of the gate insulation layer 18. In the case of using the maximum level of electric field Emax within the allowable range for the gate insulation layer 18, the maximum electric field Esub(max) which will be created inside the substrate 12 may be represented by the following equation:

$$Esub(max) = (\epsilon_1/\epsilon_2)Emax.$$

Where, "$\epsilon_1$" is the dielectric constant of $SiO_2$ constituting the gate insulation layer 18, and "$\epsilon_2$" is the dielectric constant of the silicon substrate 12. It is now apparent from the above equation that the charge amount, which makes it possible to form a depleted region in the substrate 12 by applying a voltage to the gate electrode 22, is $\epsilon_2.Esub(max)$, the value of which is approximately $1 \times 10^{13} cm^{-2}$. This fact suggests that the impurity concentration of the substrate 12 and the formation depth of the silicon germanium layer 24 should be so arranged that the integrated value of impurity concentration in the specific surface region, which includes an interface of the gate insulation layer 18 and the silicon germanium layer 24, is not greater than $1 \times 10^{13} cm^{-2}$. More preferably, the impurity concentration should be smaller than the value.

Turning now to FIG. 2, a MOSFET in accordance with another embodiment of the present invention is generally designated by reference numeral "30." It is to be noted in this drawing that similar numerals are used to designate similar component to those of the earlier embodiment shown in FIG. 1, and that detailed explanation therefor will be omitted in the following description, only for the purpose of simplification of description.

The MOSFET 30 is mainly featured in that a silicon germanium layer indicated by numeral "32" in FIG. 2 and serving as a channel region is formed by using not the aforementioned ion implantation technique, but an epitaxial growth technique. More specifically, an epitaxial layer (32) of silicon germanium grows on the top surface of the substrate 13 so as to have its thickness of a preselected value. A silicon thin film 34 is formed by epitaxial crystal growth on the epitaxial layer 32 in the same manner as in the layer 34. The layer 34 corresponds to the layer section 20 shown in FIG. 1. The resultant silicon germanium epitaxial layer 32 extends laterally through the entire ranges of the source layer 14 and the drain layer 18, as clearly illustrated in FIG. 2. With such an arrangement, the aforementioned technical advantages can also be obtained.

The MOSFET 30 may be modified so that the silicon germanium layer 32 is replaced with a non-doped silicon layer. In such a case, the carrier mobility in the channel region can be further improved to attain more excellent transistor characteristics. Obviously, the conductivity type of the silicon thin film 34 should not be limited only to the N type as shown in FIG. 2; it may be a P type. The important matter in this case is that, when the gate electrode 22 is being applied with a suitable voltage of the positive polarity, the layer section 34 positioned on the channel region of the substrate 12 (i.e., in the top surface portion of the substrate 12) is depleted successfully, and the interface region between the silicon germanium layer 32 and the silicon layer 34 is depleted simultaneously. It can be said that the above condition of channel formation is equivalent to the principle of what is called the "buried channel type MOSFET."

A MOSFET 40 in accordance with still another embodiment of the present invention is shown in FIG. 3. A silicon germanium layer 42 is so arranged as to be positioned on the top surface portion of the substrate 12. The gate insulation layer 18 provided on the substrate 12 is in direct contact with the silicon germanium layer 42. This enables the presently available thermal oxide method to be used to form the gate insulation layer 18 of better quality on the silicon geranium layer 42. The direct-junction structure of the gate insulation layer 18 and the silicon germanium layer 42 leads to improvement in the gain of the MOSFET 40. It is recommendable that device-designing is performed carefully so that the channel of MOSFET 40 is forced be accurately positioned in the interface region defined between the silicon germanium layer 42 and the silicon, which is located beneath the layer 42 in the substrate 12.

Turning now to FIG. 4, an N-channel type MOSFET 50 has a P type silicon substrate 52. The source and drain layers of the MOSFET 50 are a couple of heavily-doped N type (N+ type) semiconductor diffusion layers 54 and 56. A silicon germanium layer 58 of a preselected thickness is arranged in the substrate 52 in a similar manner as in the previously described MOSFET 10 (see FIG. 1). The layer 58 is specifically formed by ion implantation of germanium at a selected position of the substrate 52 in a way that it laterally extends to contact a source layer 54 and a drain layer 56 at the two end portions thereof. A substrate surface portion 19 which lies between the gate insulation layer 18 and the silicon germanium layer 58 is left untreated, so that the surface portion 60 remains as P type silicon. A second silicon germanium layer 60 and a third silicon germanium layer 62 are formed by germanium-ion implantation in the substrate 52. These layers 60 and 62 contain therein, or surround, the source layer 54 and the drain layer 56, respectively.

With the MOSFET 50, it becomes possible to eliminate the generation of undesirable current leakage in the junction section between the the substrate 52 and the source layer 54 and the one between the substrate 52 and the drain layer 56. Additionally, the local concentration of electric field (which means that the electric field increases locally and abnormally beyond the allowable range) can be effectively prevented from being taken place in the vicinity of the drain layer during the micro-fabrication of the transistor structure. It can thus be prevented that any unwanted hot carrier injection (e.g., hot electron phenomenon) into the gate insulation layer 18 is made due to the local concentration of electric field.

The heterostructure of this invention may be applied to not only N-channel type MOSFETs, but also P-channel type ones. The germanium-ion implantation technique for forming the heterostructure inside the silicon substrate can be applied to bipolar transistor devices.

Figure 5:
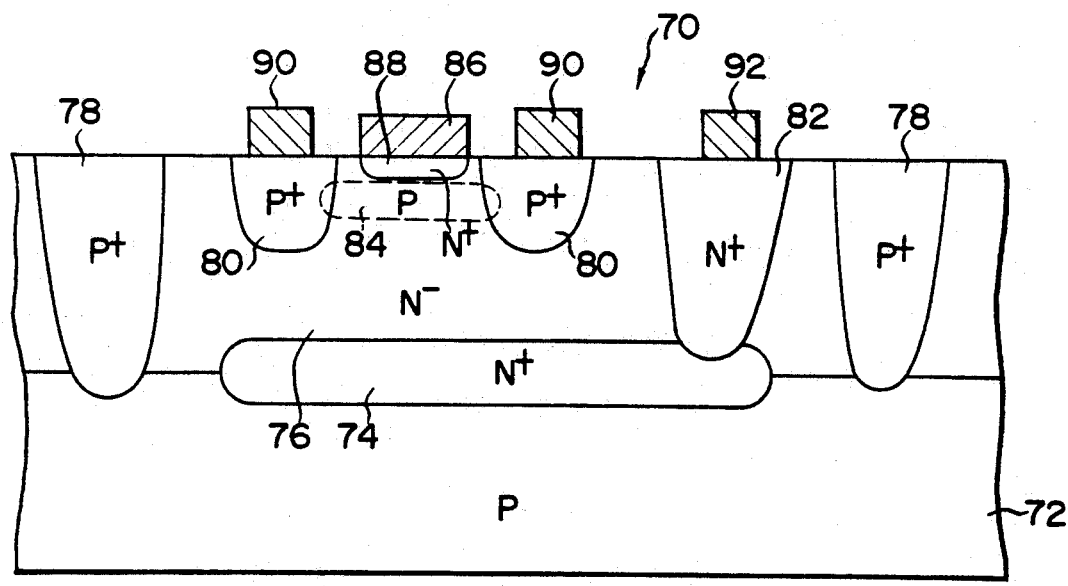
FIG. 5 is a diagram schematically showing a cross-sectional view of the main part of a bipolar transistor structure in accordance with a still further embodiment of the present invention.

A bipolar transistor structure 70 in accordance with a further embodiment of the present invention is now described with reference to FIG. 5. The bipolar transistor 70 has a P type silicon substrate 72, which has a buried N+ type layer 74 in its surface portion. This layer will be called the "collector buried layer" in the rest of the description. A lightly-doped N type (N− type) silicon layer 76 is formed by epitaxial growth on the substrate 72. The N− type epitaxial layer 76 acts as a collector of the bipolar transistor 70.

The ion implantation technique is used to dope boron selectively into the N− type collector layer 76. A P+ type layer 78 is formed which is deep enough to be contact with the substrate 72 at its bottom portion as shown in FIG. 5. The layer 78 serves as an element-isolation layer for defining a specific region within which the bipolar transistor 70 is to be formed. Boron is doped using the ion implantation to form a P+ type layer 80. This layer 80 is shallower than the P+ type element-isolation layer 78, and serves as an external base layer for the transistor 70.

An N+ type layer 82 is formed in the layer 76 by ion implantation of appropriate doping species, such as phosphorus, in such a manner that it is in contact with the buried collector layer 7 at the bottom portion thereof. Thereafter, germanium and boron are implanted simultaneously to form a silicon germanium layer 84. The layer 84 is located at a preselected depth position of the N− type collector layer 76. As shown in FIG. 5, the silicon germanium layer 84 partly overlap the P+ type external base layer 80 at its both end portions. The silicon germanium layer 84 acts as an internal base for the bipolar transistor 70. The annealing process for activating the internal base layer 84 should be performed at a carefully selected temperature, the value of which should be sufficiently low to prevent the doped boron from outdiffusing from the silicon germanium layer 84, and yet high enough to cause boron to be activated successfully as required. Such temperature value will range from 500 to 800 degrees. Alternatively, the above annealing process may be quickly performed at higher temperature for a suitably shortened time period.

Subsequently, the polycrystalline silicon layer 86 is formed on the N− type collector layer 76. The layer 86 serves as an emitter electrode of the bipolar transistor 70. By utilizing the outdiffusion of impurity from the polycrystalline silicon 86, and N+ type layer 88 is then formed in a shallow surface region of the layer 76, which is located on the silicon germanium layer 84 as shown in FIG. 5. The N+ type diffusion layer 88 is substantially self-aligned with the emitter electrode layer 86. Patterned metal layers such as aluminum layers 90 and 92 are deposited on the top surface of the layer 76 as a base electrode and a collector electrode, respectively.

The bipolar transistor 70 having the silicon/silicon-germanium heterostructure can be easily manufactured by using the germanium ion implantation technique that has been described above.

The present invention is not limited to the above-described embodiments, and may be practiced or embodied in still other ways without departing from the spirit or essential character thereof.

Figure 6:
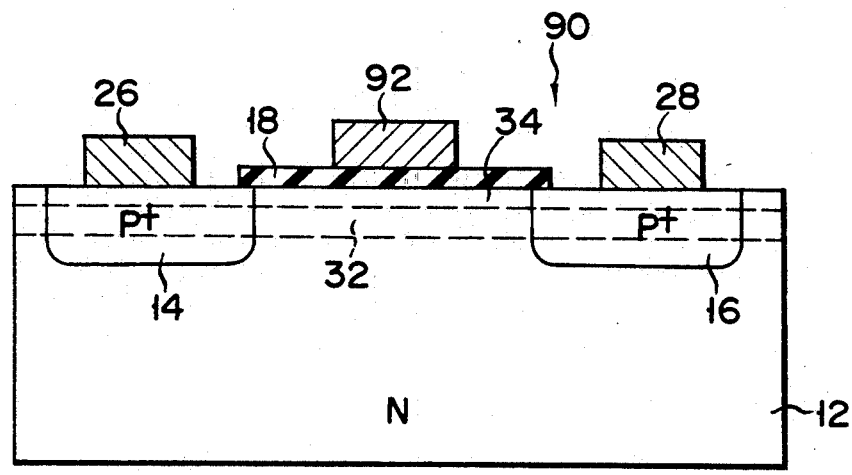
FIG. 6 is a diagram schematically showing a cross-sectional view of the main part of an insulated-gate semiconductor transistor in accordance with a modification of the transistor shown in FIG. 2.

If required, any one of the above-presented MOSFETs with the silicon/silicon-germanium heterostructure may be modified so as to have a gate electrode 92 of a decreased width as in a MOSFET 90 shown in FIG. 6. With such an arrangement, stray or parasitic capacitance generated between the gate electrode 92 and the remaining components of the MOSFET 90 are decreased, thereby to improve the characteristics thereof.

What is claimed is:

1. A semiconductor heterostructure transistor, which comprises:
    a substrate body made from silicon substrate of a first conductivity type having a surface;
    a source and a drain of a second conductivity type which are spaced apart from each other to define a channel region therebetween in said substrate body;
    a gate electrode which is electrically insulated from the channel region and which is at least partially overlying the channel region; and
    a silicon-germanium layer arranged below a silicon surface layer of the substrate body to partially extend into and coincide with said source and to partially extend into and coincide with said drain, said silicon-germanium layer having a lateral spatial extent which is limited to the coinciding regions and which essentially consists of a region between said source and said drain and which has first and second end portions that terminate within a corresponding one of said source and said drain.

2. The transistor according to claim 1, which further comprises:
    a dielectric film between said gate electrode and said substrate body surface, said film comprising silicon oxide.

3. The transistor according to claim 2, wherein:
    said gate electrode comprises a polycrystalline silicon layer.

4. The transistor according to claim 1, wherein:
    said gate electrode has edges which are substantially self-aligned with said source and with said drain.

5. The transistor according to claim 1, wherein:
    said gate electrode has a length in a direction which is parallel to the silicon-germanium layer and said length to the gate electrode is less than a length between said source and said drain, of said channel region.

6. A semiconductor heterostructure transistor, which comprises:
    a substrate body made from silicon of a first type conductivity having a surface;
    a source and a drain of a second type conductivity which are spaced apart from each other to define a channel region therebetween in said substrate body;
    a gate electrode which is electrically insulated from the channel region and which is at least partially overlying the channel region; and
    a dielectric film between said gate electrode and the substrate body surface;
    a silicon-germanium layer on the substrate body surface and having a lateral spatial extent which is limited to a region between said source and said drain, said silicon-germanium layer includes regions which partially extend into and coincide with said source and partially extend into and coincide with said drain, said silicon-germanium layer being in direct contact with said dielectric film and contacting said source and said drain, 7. The transistor according to claim 6, wherein:
    said silicon-germanium layer comprises a silicon layer doped with germanium.

8. A transistor according to claim 6, which further comprises:
    first and second conductive layers arranged on the substrate body surface to be in contact with said source and said drain, said silicon-germanium layer also being in contact with said first and second conductive layers.

9. The transistor according to claim 6, wherein:
    end portions of said silicon germanium layer terminate inside said source and said drain.

10. A bipolar heterostructure transistor, which comprises:
    a substrate body made from silicon and having a surface;
    a semiconductor collector layer of a first conductivity type in said substrate body;
    a semiconductor base region of a second conductivity type provided in the surface of said substrate body;
    a base layer below the surface of said substrate body, comprising a silicon-germanium layer having a lateral extent confined to between opposing portions of said base region, said lateral extent including regions partially extending into, coinciding with and ending in said semiconductive base region; and
    a semiconductive emitter layer of the first conductivity type which is adjacent to said base layer and disposed in the surface of said substrate body.

11. The transistor according to claim 10, wherein:
    said silicon-germanium layer comprises a silicon layer doped with germanium.

12. The transistor according to claim 11, wherein:
    said silicon-germanium layer is located below the surface of the substrate body.

* * * * *